(12) United States Patent
Ye

(10) Patent No.: US 8,840,763 B2
(45) Date of Patent: Sep. 23, 2014

(54) METHODS FOR STABLE PROCESS IN A REACTIVE SPUTTERING PROCESS USING ZINC OR DOPED ZINC TARGET

(75) Inventor: Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 615 days.

(21) Appl. No.: 12/891,893

(22) Filed: Sep. 28, 2010

(65) Prior Publication Data

US 2011/0073463 A1 Mar. 31, 2011

Related U.S. Application Data

(60) Provisional application No. 61/246,222, filed on Sep. 28, 2009.

(51) Int. Cl.
| | |
|---|---|
| *C23C 14/34* | (2006.01) |
| *C23C 14/06* | (2006.01) |
| *H01J 37/34* | (2006.01) |
| *C23C 14/00* | (2006.01) |
| *C23C 14/56* | (2006.01) |
| *C23C 14/35* | (2006.01) |

(52) U.S. Cl.
CPC ......... *C23C 14/0676* (2013.01); *H01J 37/3408* (2013.01); *C23C 14/0036* (2013.01); *C23C 14/564* (2013.01); *C23C 14/3492* (2013.01); *C23C 14/35* (2013.01)
USPC .................................. 204/192.15; 204/192.25

(58) Field of Classification Search
USPC ............... 204/192.1, 192.12, 192.15, 192.25; 438/3, 253–256, 396–399
See application file for complete search history.

(56) References Cited

U.S. PATENT DOCUMENTS

| | | | |
|---|---|---|---|
| 3,607,384 A | * | 9/1971 | Banks ........................... 428/212 |
| 4,436,770 A | | 3/1984 | Nishizawa et al. |
| 4,450,062 A | * | 5/1984 | Macaulay ................ 204/298.11 |
| 4,695,432 A | | 9/1987 | Colin et al. |

(Continued)

FOREIGN PATENT DOCUMENTS

| | | |
|---|---|---|
| CN | 1588623 A | 3/2005 |
| EP | 145403 A2 | 6/1985 |

(Continued)

OTHER PUBLICATIONS

Machine Translation to Hino (JP 05-036633) published Feb. 1993.*

(Continued)

*Primary Examiner* — John Brayton
(74) *Attorney, Agent, or Firm* — Patterson & Sheridan, LLP

(57) ABSTRACT

Embodiments disclosed herein generally relate to a method for seasoning a sputtering target in-situ with a substrate to be processed. New semiconductor compounds containing oxygen, nitrogen, and an element such as zinc, cadmium, tin, indium, and gallium are beginning to replace silicon as the material for active channels in TFTs. The new semiconductor compounds may be deposited by a reactive sputtering process. During the sputtering process, reactive gas reacts with the metal from the sputtering target and deposits on the substrate. Some of the reactive gas may react at the surface and lead to a buildup of a compound at the target surface. Because oxygen and nitrogen are quite reactive, an oxide or nitride compound may develop at the target surface. The oxide or nitride may be removed by seasoning the sputtering target. The seasoning may occur while the substrate is within the processing chamber.

20 Claims, 2 Drawing Sheets

(56) References Cited

U.S. PATENT DOCUMENTS

| | | | |
|---|---|---|---|
| 4,769,291 A | 9/1988 | Belkind et al. | |
| 4,816,082 A | 3/1989 | Guha et al. | |
| 4,983,360 A | 1/1991 | Merdrignac et al. | |
| 5,279,679 A | 1/1994 | Murakami et al. | |
| 5,346,601 A | 9/1994 | Barada et al. | |
| 5,352,300 A | 10/1994 | Niwa | |
| 5,420,452 A | 5/1995 | Tran et al. | |
| 5,522,934 A | 6/1996 | Suzuki et al. | |
| 5,571,749 A | 11/1996 | Matsuda et al. | |
| 5,620,523 A | 4/1997 | Maeda et al. | |
| 5,668,663 A | 9/1997 | Varaprasad et al. | |
| 5,683,537 A | 11/1997 | Ishii | |
| 5,700,699 A | 12/1997 | Han et al. | |
| 5,716,480 A | 2/1998 | Matsuyama et al. | |
| 5,720,826 A | 2/1998 | Hayashi et al. | |
| 5,731,856 A | 3/1998 | Kim et al. | |
| 5,993,594 A | 11/1999 | Wicker et al. | |
| 6,150,668 A | 11/2000 | Bao et al. | |
| 6,153,013 A | 11/2000 | Sakai et al. | |
| 6,153,893 A | 11/2000 | Inoue et al. | |
| 6,159,763 A | 12/2000 | Sakai et al. | |
| 6,180,870 B1 | 1/2001 | Sano et al. | |
| 6,228,236 B1 | 5/2001 | Rosenstein et al. | |
| 6,238,527 B1 | 5/2001 | Sone et al. | |
| 6,329,269 B1 | 12/2001 | Hamada et al. | |
| 6,388,301 B1 | 5/2002 | Tawada et al. | |
| 6,398,923 B1 * | 6/2002 | Ireland et al. | 204/192.17 |
| 6,458,673 B1 | 10/2002 | Cheung | |
| 6,488,824 B1 | 12/2002 | Hollars et al. | |
| 6,566,180 B2 | 5/2003 | Park et al. | |
| 6,576,482 B1 * | 6/2003 | Aggarwal et al. | 438/3 |
| 6,620,719 B1 | 9/2003 | Andry et al. | |
| 6,700,057 B2 | 3/2004 | Yasuno | |
| 6,787,010 B2 | 9/2004 | Cuomo et al. | |
| 6,825,134 B2 | 11/2004 | Law et al. | |
| 6,881,305 B2 | 4/2005 | Black et al. | |
| 6,890,803 B2 | 5/2005 | Lin et al. | |
| 6,943,359 B2 | 9/2005 | Vardeny et al. | |
| 6,953,947 B2 | 10/2005 | Son et al. | |
| 7,026,713 B2 | 4/2006 | Hoffman et al. | |
| 7,037,157 B2 | 5/2006 | Murakami et al. | |
| 7,145,174 B2 | 12/2006 | Chiang et al. | |
| 7,158,208 B2 | 1/2007 | De Jager et al. | |
| 7,189,992 B2 | 3/2007 | Wager, III et al. | |
| 7,235,810 B1 | 6/2007 | Yamazaki et al. | |
| 7,297,977 B2 | 11/2007 | Hoffman et al. | |
| 7,309,895 B2 | 12/2007 | Hoffman et al. | |
| 7,339,187 B2 | 3/2008 | Wager, III et al. | |
| 7,378,286 B2 | 5/2008 | Hsu et al. | |
| 7,382,421 B2 | 6/2008 | Hoffman et al. | |
| 7,405,114 B2 * | 7/2008 | Oishi | 438/166 |
| 7,601,984 B2 | 10/2009 | Sano et al. | |
| 7,626,201 B2 | 12/2009 | Chiang et al. | |
| 7,629,191 B2 | 12/2009 | Chiang et al. | |
| 7,750,440 B2 | 7/2010 | Yagi | |
| 7,879,698 B2 | 2/2011 | Ye | |
| 7,927,713 B2 | 4/2011 | Ye | |
| 8,377,265 B2 * | 2/2013 | Lim et al. | 204/192.23 |
| 2002/0117719 A1 | 8/2002 | Ando et al. | |
| 2002/0149053 A1 | 10/2002 | Tsunoda et al. | |
| 2003/0015234 A1 | 1/2003 | Yasuno | |
| 2003/0049464 A1 | 3/2003 | Glenn et al. | |
| 2003/0207093 A1 | 11/2003 | Tsuji et al. | |
| 2004/0018797 A1 | 1/2004 | Murakami et al. | |
| 2004/0113098 A1 | 6/2004 | Vardeny et al. | |
| 2004/0164294 A1 | 8/2004 | Son et al. | |
| 2004/0175511 A1 | 9/2004 | Hartig | |
| 2004/0235224 A1 | 11/2004 | Lin et al. | |
| 2005/0017244 A1 | 1/2005 | Hoffman et al. | |
| 2005/0028860 A1 | 2/2005 | Sano et al. | |
| 2005/0062057 A1 | 3/2005 | Yamazaki et al. | |
| 2005/0062409 A1 | 3/2005 | Yamazaki et al. | |
| 2005/0067953 A1 | 3/2005 | Yamazaki et al. | |
| 2005/0181532 A1 | 8/2005 | Patel et al. | |
| 2005/0181534 A1 | 8/2005 | Yoshimi et al. | |
| 2005/0233092 A1 | 10/2005 | Choi et al. | |
| 2005/0233595 A1 | 10/2005 | Choi et al. | |
| 2005/0251990 A1 | 11/2005 | Choi et al. | |
| 2006/0011139 A1 | 1/2006 | Sterling et al. | |
| 2006/0033106 A1 | 2/2006 | Seo et al. | |
| 2006/0038182 A1 | 2/2006 | Rogers et al. | |
| 2006/0043447 A1 | 3/2006 | Ishii et al. | |
| 2006/0046476 A1 | 3/2006 | Nakamura et al. | |
| 2006/0065299 A1 | 3/2006 | Fukawa et al. | |
| 2006/0108636 A1 | 5/2006 | Sano et al. | |
| 2006/0125098 A1 | 6/2006 | Hoffman et al. | |
| 2006/0258064 A1 | 11/2006 | Chen et al. | |
| 2006/0286725 A1 | 12/2006 | Cheng et al. | |
| 2007/0007125 A1 | 1/2007 | Krasnov et al. | |
| 2007/0026321 A1 | 2/2007 | Kumar | |
| 2007/0030569 A1 | 2/2007 | Lu et al. | |
| 2007/0057261 A1 | 3/2007 | Jeong et al. | |
| 2007/0065962 A1 | 3/2007 | Pichler | |
| 2007/0068571 A1 | 3/2007 | Li et al. | |
| 2007/0141784 A1 | 6/2007 | Wager et al. | |
| 2007/0194379 A1 | 8/2007 | Hosono et al. | |
| 2007/0252129 A1 | 11/2007 | Yagi | |
| 2007/0252147 A1 | 11/2007 | Kim et al. | |
| 2007/0252152 A1 | 11/2007 | Sato et al. | |
| 2008/0108198 A1 | 5/2008 | Wager et al. | |
| 2008/0132009 A1 | 6/2008 | Hirai | |
| 2008/0173870 A1 | 7/2008 | Kim et al. | |
| 2008/0224133 A1 | 9/2008 | Park et al. | |
| 2008/0264777 A1 | 10/2008 | Ye | |
| 2008/0272388 A1 | 11/2008 | Ushiyama et al. | |
| 2008/0308411 A1 | 12/2008 | Guo et al. | |
| 2009/0023959 A1 | 1/2009 | D'Amore et al. | |
| 2009/0026065 A1 | 1/2009 | Nukeaw et al. | |
| 2009/0045398 A1 | 2/2009 | Kato et al. | |
| 2009/0050884 A1 | 2/2009 | Ye | |
| 2009/0212287 A1 | 8/2009 | Nathan et al. | |
| 2009/0233424 A1 | 9/2009 | Ye | |
| 2009/0236597 A1 | 9/2009 | Ye | |
| 2009/0239335 A1 | 9/2009 | Akimoto et al. | |
| 2009/0305461 A1 | 12/2009 | Akimoto et al. | |
| 2010/0001274 A1 | 1/2010 | Ye | |
| 2010/0078633 A1 | 4/2010 | Watanabe | |
| 2010/0090215 A1 | 4/2010 | Lee | |
| 2010/0109002 A1 | 5/2010 | Itagaki et al. | |
| 2010/0117073 A1 | 5/2010 | Yamazaki et al. | |
| 2010/0120197 A1 | 5/2010 | Levy et al. | |
| 2010/0140611 A1 | 6/2010 | Itagaki et al. | |
| 2010/0193783 A1 | 8/2010 | Yamazaki et al. | |
| 2010/0252832 A1 | 10/2010 | Asano et al. | |

FOREIGN PATENT DOCUMENTS

| | | | |
|---|---|---|---|
| JP | 02-240637 A | | 9/1990 |
| JP | 05036633 A | * | 2/1993 |
| JP | 06-045354 A | | 2/1994 |
| JP | 3958605 | | 5/2007 |
| KR | 1999009046 | | 3/1999 |
| KR | 2001-0011855 A | | 2/2001 |
| KR | 2001051193 | | 6/2001 |
| WO | WO-2008/133345 A1 | | 11/2008 |
| WO | WO-2010/002803 | | 1/2010 |

OTHER PUBLICATIONS

Toyoura et al., "Optical properties of zinc nitride formed by molten salt electrochemical process", Thin Film Solids 492 (2005), pp. 88-92.

Ma et al., "Method of control of nitrogen content in ZnO films: Structural and photoluminescence properties", J. Vac. Sci. Technol. B 22(1), Jan./Feb. 2004, pp. 94-98.

Hoffman et al., "ZnO-based transparent thin-film transistors", Applied Physics Letters, vol. 82, No. 5, Feb. 3, 2003, pp. 733-735.

Zong et al., "Optical band gap of zinc nitride films prepared on quartz substrates from a zinc nitride target by reactive rf magnetron sputtering", Applied Surface Science 252 (2006), pp. 7983-7986.

Bain et al., "Deposition and electrical properties of N—In codoped p-type ZnO films by ultrasonic spray pyrolysis", Applied Physics Letters, vol. 84, No. 4, Jan. 26, 2004, pp. 541-543.

(56) References Cited

OTHER PUBLICATIONS

Barnes et al., "On the formation and stability of p-type conductivity in nitrogen-doped zinc oxide", Applied Physics Letters, 86, 112112 (2005).
Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.
Hosano et al., "Working hypothesis to explore novel wide band gap electrically conducting amorphous oxides and examples", Journal of Non-Crystalline Solids, 198-200 (1996) pp. 165-169.
Perkins et al., "Identification of nitrogen chemical states in N-doped ZnO via x-ray photoelectron spectroscopy", Journal of Applied Physics 97, 034907 (2005).
Yao et al., "Effects of nitrogen doping and illumination on lattice constants and conductivity behavior of zinc oxide grown by magnetron sputtering", Journal of Applied Physics 99, 123510 (2006).
Tu et al., "Nitrogen-doped p-type ZnO films prepared from nitrogen gas radio-frequency magnetron sputtering", Journal of Applied Physics 100, 053705 (2006).
Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.
Zong et al., "Structural properties of zinc nitride empty balls", Materials Letters 60 (2006), pp. 905-908.
Nomura et al., "Room-temperature fabrication of transparent flexible thin-film transistors using amorphous oxide semiconductors", Nature, vol. 432, Nov. 25, 2004, pp. 788-492.
Minami, Tadatsugu, "New n-Type Transparent Conducting Oxides", MRS Bulletin, Aug. 2000.
Zong et al., "Synthesis and thermal stability of $Zn_3N_2$ powder", Solid State Communications 132 (2004), pp. 521-525.
Kaminska et al., "Transparent p-type ZnO films obtained by oxidation of sputter-deposited $Zn_3N_2$", Solid State Communications, 135 (2005), pp. 11-15.
Futushara et al., "Optical properties of zinc oxynitride thin films", Thin Film Solids, 317 (1998), pp. 322-325.
Futushara et al., "Structural, electrical and optical properties of zinc nitride thin films prepared by reactive rf magnetron sputtering", Thin Film Solids, 322 (1998), pp. 274-281.
Carcia et al., "Transparent ZnO thin-film transistor fabricated by rf magnetron sputtering", Applied Physics Letters, col. 82, No. 7, Feb. 17, 2003, pp. 1117-1119.
Yan et al., "Control of Doping by Impurity Chemical Potentials: Predictions for p-type ZnO", Physical Review Letters, vol. 86, No. 25, Jun. 18, 2001, pp. 5723-5726.
Ohya et al., "Thin Film Transistor of ZnO Fabricated by Chemical Solution Deposition", Jpn. J. Appl. Phys., vol. 40 (2001), pp. 297-298.
Hossain, et al., "Modeling and simulation of polycrystalline ZnO thin-film transistors", Journal of Applied Physics, vol. 94, No. 12, Dec. 15, 2003, pp. 7768-7777.
Hirao et al., "Bottom-Gate Zinc Oxide Thin-Film Transistors (ZnO TFTs) for AM-LCDs", IEEE Transactions on Electron Devices, col. 55, No. 11, Nov. 2008, pp. 3136-3142.
Ozgur, et al. "A comprehensive review of ZnO materials and devices," Journal of Applied Physics 98, 041301 (2005), American Institute of Physics.
Wang, et al. "Epitaxial growth of NH3-doped ZnO thin films on <0224> oriented sapphire substrates," Journal of Crystal Growth 255, Apr. 9, 2003, pp. 293-297.
Ye, et al. "Preparation and characteristics of p-type ZnO films by DC reactive magnetron sputtering," Journal of Crystal Growth 253, Feb. 4, 2003, pp. 258-264.
Korean Office Action dated Jul. 21, 2008 for Korean Application No. 10-2007-0066962.
Hiramatsu, et al. "Formation of TiN films with low Cl concentration by pulsed plasma chemical vapor deposition," American Vacuum Society, vol. 14, No. 3, May/Jun. 1996, pp. 1037-1040.

Son et al., "Threshold Voltage Control of Amorphous Gallium Indium Zinc Oxide TFTs by Suppressing Back-Channel Current" Electrochemical and Solid-State Letters, 12 (1) H26-H28 (2009).
Fortunato, et al. "Fully transparent ZnO thin-film transistor produced at room temperature," Advanced Materials, 2005, 17, No. 5, Mar. 6, 2005, Wiley-VCH verlag Gbmh & Co. KGaA, Weinheim, pp. 590-594.
Hiramatsu et al. "4.1: Distinguished Paper: High Mobility Top-Gate Zinc Oxide Thin-Film Transistors (ZnO-TFTs) for Active-Matrix Liquid Crystal Displays," SID 06 Digest ISSN0006-0966X/06/3701-0018-$1.00+.00, 2006, pp. 18-20.
Li et al. "Progress in semiconducting oxide-based thin-film transistors for displays," Institute of Physics, Semicon. Sci. Technol. 20 (2005), pp. 720-725.
Masuda et al. "Transparent thin film transistors using ZnO as an active channel layer and their electrical properties," Journal of Applied Physics, vol. 93, No. 3, Feb. 1, 2003, American Institute of Physics, pp. 1624-1630.
International Search Report and Written Opinion dated Aug. 8, 2008 for International Application No. PCT/US08/59638.
International Search Report and Written Opinion dated Oct. 8, 2008 for International Application No. PCT/US08/71890.
International Search Report and Written Opinion dated Oct. 15, 2007 for International Application No. PCT/US07/66166.
Search Report and Written Opinion for PCT/US2009/049084 dated Jan. 25, 2010.
Freeman et al., "Chemical and Thin-Film Strategies for New Transparent Conducting Oxides", MRS Bulletin, Aug. 2000, p. 45-51.
Jin et al., "Optical properties of transparent and heat reflecting ZnO:Al films made by reactive sputtering", Appl. Phys. Lett. 51 (3), Jul. 20, 1987, p. 149-151.
Pei et al., "Optical and electrical properties of direct-current magnetron sputtered ZnO:Al films", Journal of Applied Physics, vol. 90, No. 7, Oct. 1, 2001, p. 3432-3436.
Gordon, "Criteria for Choosing Transparent Conductors", MRS Bulletin, Aug. 2000, p. 52-57.
European search report dated Jun. 30, 2010 for European Patent Application 08797025.7.
Barnes et al., "A comparison of plasma-activated N2/O2 and N2)/O2 mixtures for use in ZnO:N synthesis by chemical vapor deposition", Journal of Applied Physics, vol. 96, No. 12 (Dec. 2004).
Cao et al., "Low resistivity p-ZnO films fabricated by sol-gel spin coating", Applied Physics Letters, 88, 251116 (Jun. 2006).
Zhao et al., "Growth of nitrogen-doped p-type ZnO films by spray pyrolysis and their electrical and optical properties", Journal of Crystal Growth, 280 (May 2005), pp. 495-501.
Barnes et al., "A comparison of plasma-activated N2/O2 and N2O/O2 mixtures for use in ZnO:N synthesis by chemical vapor deposition", Journal of Applied Physics, vol. 96, No. 12 (Dec. 2004).
Zhao et al., "Growth of nitrogen-doped p-type ZnO films by spray pyrolysis and their electrical and optical properties", Journal of Crystal Growth, 280 (May 2005), 495-501.
Ye et al., "High mobility amorphous zinc oxynitride semiconductor material for thin film transistors", Journal of Applied Physics, 106, 074512 (2009).
Chiang et al., "High mobility transparent thin-film transistors with amorphous zinc tin oxide channel layer", Appl. Phys. Lett., 86, 013503 (2005).
Jackson et al., "High-performance flexible zinc tin oxide field-effect transistors", Applied Physics Letters, 87, 193503 (2005).
Lu, et al., "P-type ZnO films deposited by DC reactive magnetron sputtering at different ammonia concentrations," Materials Letters 57, Jan. 13, 2003, pp. 3311-3314.
First Office Action for Chinese Patent Application No. 200880015621.X dated Nov. 24, 2010.
Wang et al., "Fabrication and characteristics of the low-resistive p-type ZnO thin films by DC reactive magnetron sputtering", Materials Letters, vol. 60, p. 912-914, Dec. 31, 2006.
Wang, "The optical and electrical characteristics and the microstructure of Al doped zinc oxide thin films", Dept. of Information material science and engineering Guilin, vol. 25(02), p. 19-22, Apr. 20, 2005.

(56) References Cited

OTHER PUBLICATIONS

Li, "The growth of high quality ZnO thin films at low temperature by PECVD & study of its properties", Chinese doctoral dissertations & master's theses full-text database (doctor) basic sciences, Journal 2nd, A005-11, Dec. 15, 2002.
Search report and written opinion for PCT/US2009/047966 dated Dec. 27, 2010.
Search report and written opinion for PCT/US2009/049092 dated Dec. 27, 2010.
Lu et al., "p-type conduction in N—Al co-doped ZnO thin films", Applied Physics Letters, vol. 85, No. 15, Oct. 2004, p. 3134-3135.
Zhuge et al., "ZnO p-n homojunctions and ohmic contacts to Al—N-co-doped p-type ZnO", Applied Physics Letters, vol. 87, Aug. 2005.
dit Picard et al., "Detection of NH3 and H2S with thick film semiconductor sensors based on Cd2-xGeO4-x-3yN2y oxynitrides", Sensors and Actuators B, vol. 42, 1997, pp. 47-51.
Office Action for Chinese Patent Application No. 200880106291.5 dated Mar. 30, 2011.
International Search Report and Written Opinion for PCT/US2010/049239 dated May 4, 2011.
Fortunato et al., "Wide-bandgap high-mobility ZnO thin-film transistors produced at room temperature", Applied Physics Letters, vol. 85, No. 13, Sep. 27, 2004, pp. 2541-2543.
Park et al., "Highly Stable $Ga_2O_3$—$In_2O_3$—ZnO Thin-Film Transistors for AM-OLED Application", International Display Workshop '07, Sapporo, Japan, Dec. 5-7, 2007, pp. 1775-1778.
Kwon et al., "4 inch QVGA AMOLED display driven by GaInZnO TFT", International Display Workshop '07, Sapporo, Japan, Dec. 5-7, 2007, pp. 1783-1786.
Lee et al., "42.2: World's Largest (15-inch) XGA AMLCD Panel Using IGZO Oxide TFT", SID 08 Digest vol. 39, Issue 1, May 2008, pp. 625-628.
Son et al., "42.4L: Late-News Paper: 4 inch QVGA AMOLED Driven by the Threshold Voltage Controlled Amorphous GIZO (Ga2O3—In2O3—ZnO) TFT", SID 08 Digest, May 2008, pp. 633-636, vol. 39, Issue 1.
Park et al., "Challenge to Future Displays: Transparent AM-OLED driven by PEALD grown ZnO TFT", IMID '07 Digest, Aug. 27-31, 2007, pp. 1249-1252.

\* cited by examiner

METHODS FOR STABLE PROCESS IN A REACTIVE SPUTTERING PROCESS USING ZINC OR DOPED ZINC TARGET

CROSS-REFERENCE TO RELATED APPLICATIONS

This application claims benefit of U.S. Provisional Patent Application Ser. No. 61/246,222, filed Sep. 28, 2009, which is herein incorporated by reference.

BACKGROUND OF THE INVENTION

1. Field of the Invention

Embodiments disclosed herein generally relate to a method for seasoning a sputtering target in-situ with a substrate to be processed.

2. Description of the Related Art

The electron mobility of a semiconductor layer has a very strong effect on the speed of the device and the current which may be driven through the device. The higher the electron mobility, the faster the speed of the device and the higher the source-drain current under the same voltage. In recent years, amorphous silicon and polysilicon have been the semiconductor materials of choice for field effect transistors (FETs) such as thin film transistors (TFTs), for backplane to drive liquid crystal displays (LCDs), organic light emitting diode (OLED) displays, quantum dot displays, and building solar cell panels. Amorphous silicon may have an electron mobility as high as about 1 cm$^2$/V-s. Low temperature polysilicon may have an electron mobility higher than 50 cm$^2$/V-s, but requires a complicated process step such as laser annealing to achieve the electron mobility. Therefore, the cost of producing polysilicon with an electron mobility higher than 50 cm$^2$/V-s is very high and not suitable for large area substrate applications.

In an FET, the semiconductor material creates the channel between the source and drain electrodes. Without a voltage supply to the gate electrode, no current may go through the source-drain electrodes even with a voltage between the source-drain electrodes. As voltage is supplied to the gate electrode, mobile electrons inside the semiconductor layer will accumulate in the area very close to the interface between the gate dielectric layer and the semiconductor layer. The semiconductor layer becomes conductive, and electrons may go through the source-drain electrode easily with a low voltage between the source-drain electrodes. High mobility of the semiconductor materials indicates the mobile electrons in the semiconductor are more sensitive to the electric field created by the gate electrode, and the semiconductor channel becomes more conductive. The semiconductor material determines the current which may go through the semiconductor channel influenced by voltage applied across the gate and source terminals. The greater the mobility of the semiconductor material, the less voltage is needed to achieve the current required across the FET.

Amorphous silicon may rely upon hydrogen passivation to achieve a desired mobility in a TFT. The amorphous silicon may be deposited by chemical vapor deposition (CVD) at temperatures up to about 350 degrees Celsius. The hydrogen passivation, while helping the amorphous silicon achieve the desired mobility, may not be stable such that a TFT's threshold voltage may change with time under gate electrode voltage and under relatively high temperatures created by the device itself.

In recent years, transparent TFTs have been created in which zinc oxide has been used as the active channel layer. Zinc oxide is a compound semiconductor that can be grown as a crystalline material at relatively low deposition temperatures on various substrates such as glass and plastic.

Sputtering may be used to deposit the active channel for TFTs. During a sputtering operation, material may deposit not only on the substrate, but also along the other exposed surfaces of the processing chamber. The deposition on the surfaces could change the process chamber since the deposition may change the process chemistry by consuming or releasing reactants, or the deposition may change the plasma condition due to conductivity changes. Therefore, the processing chamber is periodically off-line to permit the chamber to be cleaned. When the processing chamber is off-line, substrate throughput is diminished.

Therefore, there is a need in the art to produce a stable, high quality semiconductor material having sufficiently high mobility not only on glass substrates with high process temperatures, but also on plastic substrates and other flexible substrates. There is also a need in the art for a sputtering process that reduces the negative impact of chamber cleaning.

SUMMARY OF THE INVENTION

Embodiments disclosed herein generally relate to a method for seasoning a sputtering target in-situ with a substrate to be processed. New semiconductor compounds containing oxygen, nitrogen, and an element such as zinc, cadmium, tin, indium, and gallium are beginning to replace silicon as the material for active channels in TFTs. The new semiconductor compounds may be deposited by a reactive sputtering process. During the sputtering process, reactive gas reacts with the metal from the sputtering target and deposits on the substrate. Some of the reactive gas may react at the surface and lead to a buildup of a compound at the target surface. Because oxygen and nitrogen are quite reactive, an oxide or nitride compound may develop at the target surface. The oxide or nitride may be removed by seasoning the sputtering target. The seasoning may occur while the substrate is within the processing chamber.

In one embodiment, a method is disclosed. The method includes disposing a substrate onto a substrate support in a processing chamber. The processing chamber has a sputtering target disposed therein opposite the substrate support. The sputtering target comprises an element selected from the group consisting of zinc, cadmium, tin, indium, gallium and combinations thereof. The method additionally includes performing a first seasoning process. The first seasoning process includes introducing an inert gas and a nitrogen containing gas into the processing chamber and applying a DC bias to the sputtering target to sputter material from the target. The method also includes reducing the DC bias to a second DC bias and performing a first sputtering process. The first sputtering process includes introducing an oxygen containing gas along with the inert gas and nitrogen containing gas, increasing the DC bias to a third DC bias to sputter material from the target and depositing a first layer having a first composition on the substrate that comprises oxygen, nitrogen and one or more elements selected from the group consisting of zinc, cadmium, tin, indium, gallium and combinations thereof.

In another embodiment, a method is disclosed. The method includes disposing a substrate onto a substrate support in a processing chamber. The processing chamber has a sputtering target disposed therein opposite the substrate support. The sputtering target comprises an element selected from the group consisting of zinc, cadmium, tin, indium, gallium and combinations thereof. The method includes performing a sputtering process that comprises introducing an inert gas, an oxygen containing gas and a nitrogen containing gas into the processing chamber, applying a DC bias to the sputtering target to sputter material from the target and depositing a layer on the substrate that comprises oxygen, nitrogen and one or more elements selected from the group consisting of zinc, cadmium, tin, indium, gallium and combinations thereof. The method also includes a seasoning process. The seasoning process includes reducing the flow of oxygen containing gas to the processing chamber while continuing to flow the inert gas and the nitrogen continuing gas and sputtering material from the sputtering target while the substrate remains in the processing chamber.

In another embodiment, a method is disclosed. The method includes disposing a substrate onto a substrate support in a processing chamber. The processing chamber has a sputtering target disposed therein opposite the substrate support. The sputtering target comprises an element selected from the group consisting of zinc, cadmium, tin, indium, gallium and combinations thereof. The method includes performing a first sputtering process comprising introducing an inert gas, an oxygen containing gas and a nitrogen containing gas into the processing chamber, applying a DC bias to the sputtering target to sputter material from the target and depositing a first layer having a first composition on the substrate that comprises oxygen, nitrogen and one or more elements selected from the group consisting of zinc, cadmium, tin, indium, gallium and combinations thereof. The method also includes performing a seasoning process comprising reducing the flow of oxygen containing gas to the processing chamber while continuing to flow the inert gas and the nitrogen containing gas into the processing chamber and sputtering material from the sputtering target while the substrate remains in the processing chamber. The method also includes performing a second sputtering process comprising introducing the oxygen containing gas into the processing chamber along with the inert gas and the nitrogen containing gas and depositing a second layer having a second composition different than the first composition on the substrate that comprises oxygen, nitrogen and one or more elements selected from the group consisting of zinc, cadmium, tin, indium, gallium and combinations thereof.

The reaction conditions are intentionally setup differently for different locations in the chamber such as the sputtering target, the substrate and exposed surfaces. Therefore, films deposited on different locations have different characteristics during the deposition process as well as during the cleaning. Different conditions can be achieved through controlling the surfaces with different temperatures, different ion bombardment energy, and difference exposure for reactants.

For example, the sputtering target should be set at a temperature lower than the substrate. Therefore, the reaction rate will be controlled through ion bombardment energy. During the deposition process, the ion bombardment is controlled so that the ion energy is high enough to minimize the redeposition of the byproduct, and low enough to avoid inducing other reactions on the target. During the cleaning process, the ion bombardment energy on the target should be high enough to remove the re-deposited byproduct but not enough to induce re-deposition on the substrate.

The reaction condition on the other exposed surface is mainly controlled by the temperature and exposure to the reactants. For a ZnON process, the temperature of the surface other than the substrate or target is set at a higher temperature than the target and at a lower temperature than the substrate. The higher temperature than the target enables the surfaces to have certain reduction reactions even though the ion bombardment energy is lower there. The lower temperature than the substrates make the deposition on the surface less oxidized than the film deposited on the substrate, so that sufficient reduction or cleaning takes place on the surfaces but not on the film at the substrate.

In one embodiment, the target is maintained at a temperature of between about 20 degrees Celsius to about 40 degrees Celsius, a susceptor is maintained at a temperature of between about 160 degrees Celsius and about 200 degrees Celsius, and a liner between the target and susceptor is maintained at a temperature of between about 80 degrees Celsius and about 120 degrees Celsius. In another embodiment, the target is maintained at about room temperature, a susceptor is maintained at a temperature of about 180 degrees Celsius, and a liner between the target and susceptor is maintained at a temperature of about 100 degrees Celsius.

In another embodiment, the target is maintained at a temperature of between about 20 degrees Celsius to about 40 degrees Celsius, a susceptor is maintained at a temperature of between about 280 degrees Celsius and about 320 degrees Celsius, and a liner between the target and susceptor is maintained at a temperature of between about 130 degrees Celsius and about 170 degrees Celsius. In another embodiment, the target is maintained at a temperature of about room temperature, a susceptor is maintained at a temperature of about 300 degrees Celsius, and a liner between the target and susceptor is maintained at a temperature of about 150 degrees Celsius. In other words, the liner may be maintained at a temperature that is about halfway between the temperature of the susceptor and target.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to a method for seasoning a sputtering target and other exposed surfaces in-situ with a substrate to be processed. New semiconductor compounds containing oxygen, nitrogen, and an element such as zinc, cadmium, tin, indium, and gallium are beginning to replace silicon as the material for active channels in TFTs. The new semiconductor compounds may be deposited by a reactive sputtering process. During the sputtering process, reactive gas reacts with the metal from the sputtering target and deposits on the substrate. Some of the reactive gas may react at the surface and lead to a buildup of a compound at the target surface. Because oxygen and nitrogen are quite reactive, an oxide or nitride compound may develop at the target surface. The oxide or nitride may be removed by seasoning the sputtering target. The surface condition on the other exposed surfaces may be different both before and after the deposition process of the film deposited thereon becomes less conductive than before (i.e., the semiconductor materials produced are not very conductive). The seasoning may occur while the substrate is within the processing chamber. The seasoning is often used to remove the small amount of byproduct that has accumulated on the target as well as a large amount of metallic species from the target. The metallic species covers the chamber surfaces to make the chamber surface similar to the sputtered material and the deposition film conductive.

Figure 1:
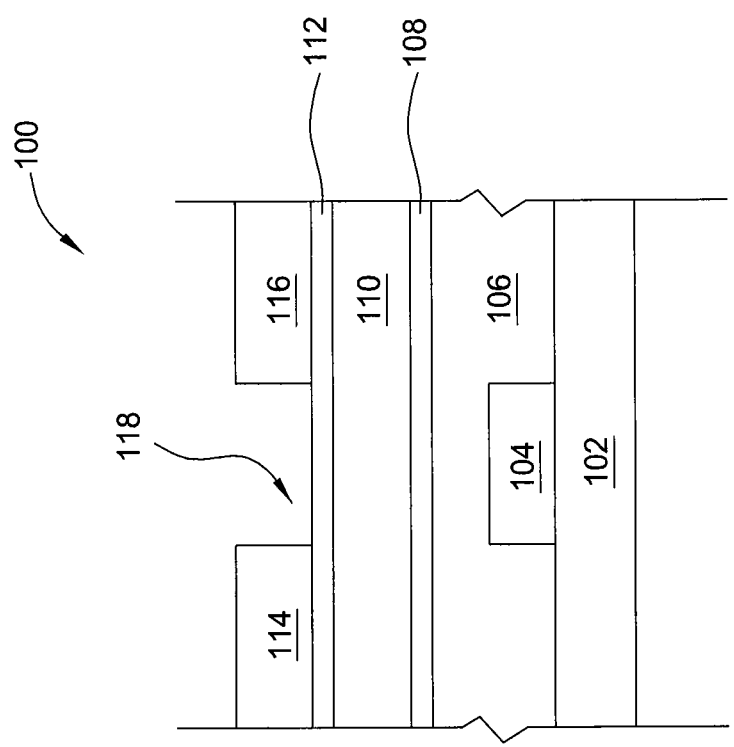
FIG. 1 is a schematic cross-sectional view of a bottom-gate TFT according to one embodiment.

FIG. 1 is a schematic cross-sectional view of a bottom-gate TFT 100 according to one embodiment. The TFT 100 comprises a substrate 102 with multiple layers deposited thereover. In one embodiment, the substrate 102 may comprise glass. In another embodiment, the substrate 102 may comprise a polymer. In another embodiment, the substrate 102 may comprise plastic. In still another embodiment, the substrate 102 may comprise metal.

Over the substrate, a gate electrode 104 may be formed. The gate electrode 104 may comprise an electrically conductive layer that controls the movement of charge carriers within the TFT. The gate electrode 104 may comprise a metal such as aluminum, tungsten, chromium, tantalum, or combinations thereof. The gate electrode 104 may be formed using conventional deposition techniques including sputtering, lithography, and etching. Over the gate electrode 104, a gate dielectric layer 106 may be deposited. The gate dielectric layer 106 may comprise silicon dioxide, silicon oxynitride, silicon nitride, or combinations thereof. The gate dielectric layer 106 may be deposited by well known deposition techniques including plasma enhanced chemical vapor deposition (PECVD).

Over the gate dielectric layer 106, the active material for the TFT 100 may be formed. The active material may comprise a single layer or multiple layers as shown. The first layer that interfaces with the gate dielectric layer 106 is referred to as a gate control layer 108. The next layer of the active material is referred to as the bulk layer 110. The next layer of the active material interfaces with the source and drain electrode 114, 116 and is referred to as the interface control layer 112. In one embodiment, the source and drain electrodes 114, 116 may comprise a metal such as aluminum, tungsten, molybdenum, chromium, tantalum, and combinations thereof. In order to define the active channel 118 and the layer that forms the source and drain electrodes 114, 116, may be etched after deposition. The active material for the gate control layer 108, bulk layer 110 and interface control layers 112 may all comprise the same components, but have different compositions tailored to suit the needs of the application.

The active material layers may be formed by sputtering. An exemplary sputtering chamber that may be used to practice the embodiments discussed herein is the a 4300 PVD chamber, available from AKT, a subsidiary of Applied Materials, Inc., Santa Clara, Calif. However, it is also to be understood that the embodiments discussed herein may be practiced in other chambers as well, including those sold by other manufacturers.

Figure 2:
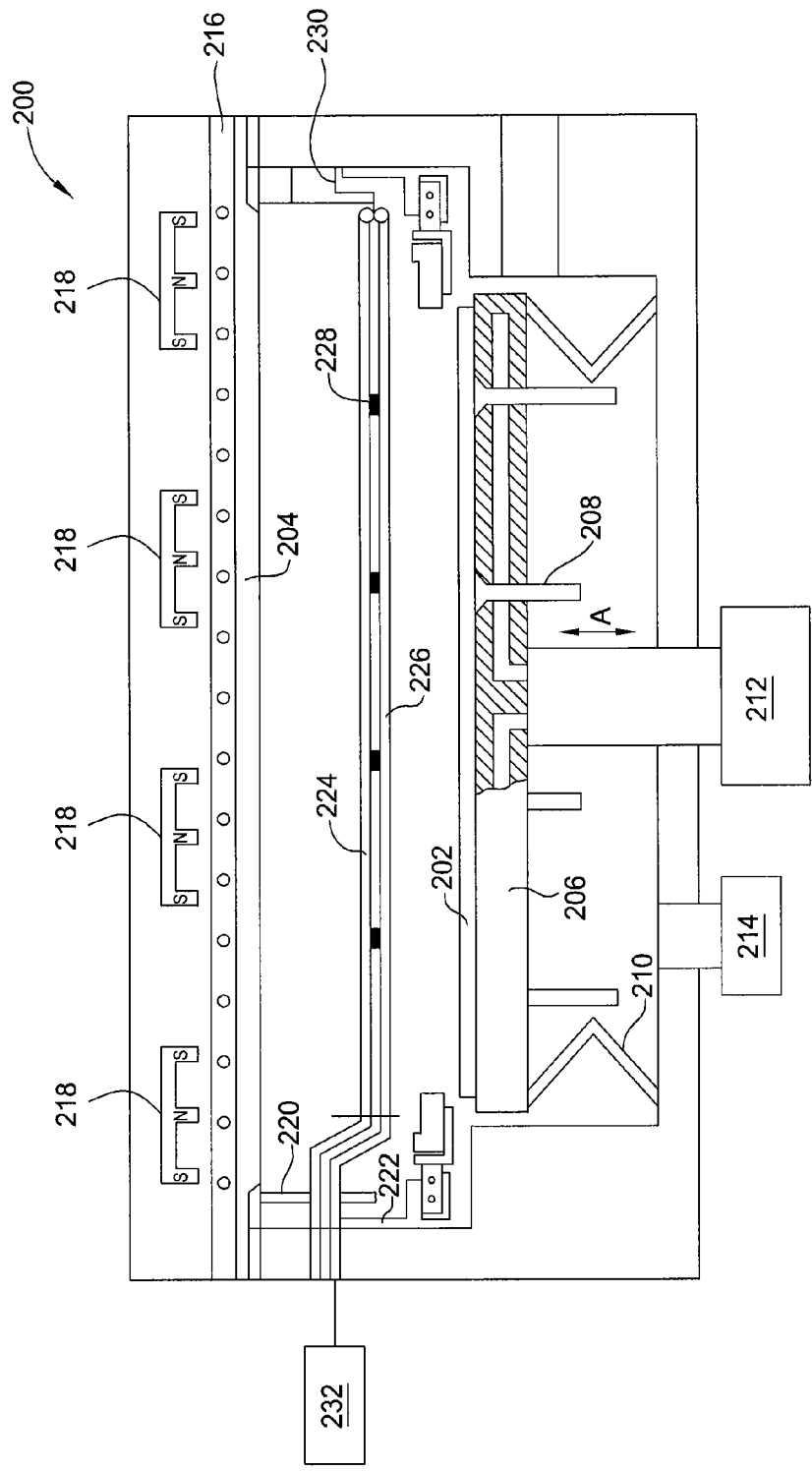
FIG. 2 is a schematic cross sectional view of a sputtering chamber that may be used to deposit the semiconductor film according to one embodiment.

FIG. 2 is a schematic cross sectional view of a sputtering chamber that may be used to deposit the semiconductor film according to one embodiment. The chamber 200 may be evacuated by a vacuum pump 214. Within the chamber 200, a substrate 202 may be disposed opposite a target 204. The substrate may be disposed on a susceptor 206 within the chamber 200. The susceptor 206 may be elevated and lowered as shown by arrows "A" by an actuator 212. The susceptor 206 may be elevated to raise the substrate 202 to a processing position and lowered so that the substrate 202 may be removed from the chamber 200. Lift pins 208 elevate the substrate 202 above the susceptor 206 when the susceptor 206 is in the lowered position. Grounding straps 210 may ground the susceptor 206 during processing. The susceptor 206 may be raised during processing to aid in uniform deposition. The temperature of the susceptor 206 may be maintained within a range of about room temperature to about 400 degrees Celsius. In one embodiment, the temperature of the susceptor 206 may be maintained between about 25 degrees Celsius and about 250 degrees Celsius.

The target 204 may comprise one or more targets 204. In one embodiment, the target 204 may comprise a large area sputtering target 204. In another embodiment, the target 204 may comprise a plurality of tiles. In yet another embodiment, the target 204 may comprise a plurality of target strips. In still another embodiment, the target 204 may comprise one or more cylindrical, rotary targets. The target 204 may be bonded to a backing plate 216 by a bonding layer (not shown). One or more magnetrons 218 may be disposed behind the backing plate 216. The magnetrons 218 may scan across the backing plate 216 in a linear movement or in a two dimensional path. The walls of the chamber may be shielded from deposition by a dark space shield 220 and a chamber shield 222.

To help provide uniform sputtering deposition across a substrate 202, an anode 224 may be placed between the target 204 and the substrate 202. In one embodiment, the anode 224 may be bead blasted stainless steel coated with arc sprayed aluminum. In one embodiment, one end of the anode 224 may be mounted to the chamber wall by a bracket 230. The anode 224 provides a charge in opposition to the target 204 so that charged ions will be attracted thereto rather than to the chamber walls which are typically at ground potential. By providing the anode 224 between the target 204 and the substrate 202, the plasma may be more uniform, which may aid in the deposition. To reduce flaking, a cooling fluid may be provided through the one or more anodes 224. By reducing the amount of expansion and contraction of the anodes 224, flaking of material from the anodes 224 may be reduced. For smaller substrates and hence, smaller processing chambers, the anodes 224 spanning the processing space may not be necessary as the chamber walls may be sufficient to provide a path to ground and a uniform plasma distribution.

For reactive sputtering, it may be beneficial to provide a reactive gas into the chamber 200. One or more gas introduction tubes 226 may also span the distance across the chamber 200 between the target 204 and the substrate 202. For smaller substrates and hence, smaller chambers, the gas introduction tubes 226 spanning the processing space may not be necessary as an even gas distribution may be possible through conventional gas introduction means. The gas introduction tubes 226 may introduce sputtering gases from a gas panel 232. The gas introduction tubes 226 may be coupled with the anodes 224 by one or more couplings 228. The coupling 228 may be made of thermally conductive material to permit the gas introduction tubes 226 to be conductively cooled. Additionally, the coupling 228 may be electrically conductive as well so that the gas introduction tubes 226 are grounded and function as anodes.

The reactive sputtering process may comprise disposing a metallic sputtering target opposite a substrate in a sputtering chamber. The metallic sputtering target may substantially comprise one or more elements selected from the group consisting of zinc, gallium, indium, tin, and cadmium. In one embodiment, the sputtering target may comprise one or more elements having a filled s orbital and a filled d orbital. In another embodiment, the sputtering target may comprise one or more elements having a filled f orbital. In another embodiment, the sputtering target may comprise one or more divalent elements. In another embodiment, the sputtering target may comprise one or more trivalent elements. In still another embodiment, the sputtering target may comprise one or more tetravalent elements.

The sputtering target may also comprise a dopant. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. In another embodiment, the dopant comprises tin. The substrate, on the other hand, may comprise plastic, paper, polymer, glass, stainless steel, and combinations thereof. When the substrate is plastic, the reactive sputtering may occur at temperatures below about 180 degrees Celsius. Examples of semiconductor films that may be deposited include $ZnO_xN_y$:Al, $ZnO_xN_y$:Sn, $SnO_xN_y$:Al, $InO_xN_y$:Al, $InO_xN_y$:Sn, $CdO_xN_y$:Al, $CdO_xN_y$:Sn, $GaO_xN_y$:Al, $GaO_xN_y$:Sn, $ZnSnO_xN_y$:Al$ZnInO_xN_y$:Al, $ZnInO_xN_y$:Sn, $ZnCdO_xN_y$:Al, $ZnCdO_xN_y$:Sn, $ZnGaO_xN_y$:Al, $ZnGaO_xN_y$:Sn, $SnInO_xN_y$:Al, $SnCdO_xN_y$:Al, $SnGaO_xN_y$:Al, $InCdO_xN_y$:Al, $InCdO_xN_y$:Sn, $InGaO_xN_y$:Al, $InGaO_xN_y$:Sn, $CdGaO_xN_y$:Al, $CdGaO_xN_y$:Sn, $ZnSnInO_xN_y$:Al, $ZnSnCdO_xN_y$:Al, $ZnSnGaO_xN_y$:Al, $ZnInCdO_xN_y$:Al, $ZnInCdO_xN_y$:Sn, $ZnInGaO_xN_y$:Al, $ZnInGaO_xN_y$:Sn, $ZnCdGaO_xN_y$:Al, $ZnCdGaO_xN_y$:Sn, $SnInCdO_xN_y$:Al, $SnInGaO_xN_y$:Al, $SnCdGaO_xN_y$:Al, $InCdGaO_xN_y$:Al, $InCdGaO_xN_y$:Sn, $ZnSnInCdO_xN_y$:Al, $ZnSnInGaO_xN_y$:Al, $ZnInCdGaO_xN_y$:Al, $ZnInCdGaO_xN_y$:Sn, and $SnInCdGaO_xN_y$:Al.

During the sputtering process, argon, a nitrogen containing gas, and an oxygen containing gas may be provided to the chamber for reactive sputtering the metallic target. Additional additives such as $B_2H_6$, $CO_2$, CO, $CH_4$, and combinations thereof may also be provided to the chamber during the sputtering. In one embodiment, the nitrogen containing gas comprises $N_2$. In another embodiment, the nitrogen containing gas comprises $N_2O$, $NH_3$, or combinations thereof. In one embodiment, the oxygen containing gas comprises $O_2$. In another embodiment, the oxygen containing gas comprises $N_2O$. The nitrogen of the nitrogen containing gas and the oxygen of the oxygen containing gas react with the metal from the sputtering target to form a semiconductor material comprising metal, oxygen, nitrogen, and optionally a dopant on the substrate. In one embodiment, the nitrogen containing gas and the oxygen containing gas are separate gases. In another embodiment, the nitrogen containing gas and the oxygen containing gas comprise the same gas.

The film deposited is a semiconductor film. Examples of semiconductor films that may be deposited include $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Each of the aforementioned semiconductor films may be doped by a dopant.

The semiconductor film may comprise an oxynitride compound. In one embodiment, the semiconductor film comprises both a metal oxynitride compound as well as a metal nitride compound. In another embodiment, the semiconductor film may comprise a metal oxynitride compound, a metal nitride compound, and a metal oxide compound. In still another embodiment, the semiconductor film may comprise a metal oxynitride compound and a metal oxide compound. In another embodiment, the semiconductor film may comprise a metal nitride compound and a metal oxide compound.

During the sputtering process, material may deposit on all exposed surfaces of the processing chamber. In particular, because oxygen and nitrogen are quite reactive, a thin oxide or nitride layer may form on the target surface. Because the sputtering process is a DC sputtering process, the sputtering rate reduces as the oxide or nitride layer builds up on the sputtering target. Additionally, because the oxygen and nitrogen reacts with the metal sputtering target to form an oxide or nitride, it becomes more difficult to be able to control the morphology of the deposited film because the oxide or nitride tends to be crystalline rather than amorphous. Thus, the sputtering target is periodically cleaned or seasoned to remove the oxide layer from the sputtering target. It has surprisingly been found that the cleaning/seasoning may occur with the substrate still in the processing chamber (i.e., in-situ).

TABLE I

| Power W | Time sec | Ar sccm | $N_2$ sccm | $N_2O$ sccm | $NH_3$ sccm | Active Layer |
|---|---|---|---|---|---|---|
| 500 | 30 | 120 | 500 | 0 | 10 | GC |
| 10 | 12 | 120 | 500 | 0 | 0 | |
| 500 | 30 | 120 | 500 | 0 | 0 | |
| 500 | 36 | 120 | 500 | 40 | 0 | |
| 500 | 24 | 120 | 500 | 0 | 0 | |
| 500 | 30 | 120 | 500 | 30 | 0 | |
| 500 | 24 | 120 | 500 | 0 | 0 | |
| 500 | 300 | 120 | 500 | 30 | 0 | Bulk |
| 1000 | 24 | 120 | 500 | 30 | 0 | IC |
| 1000 | 24 | 120 | 500 | 40 | 0 | |
| 1000 | 24 | 120 | 500 | 50 | 0 | |

Table I shows the deposition conditions for a multi-layer active material for a TFT according to one embodiment. The deposition occurred at a temperature of 180 degrees Celsius in a processing chamber having zinc sputtering target with a size of about 4650 $cm^2$ and a chamber volume of about 130000 $cm^3$. The first layer deposited was the gate control layer that is deposited over the gate dielectric layer. Prior to depositing the gate control layer, the target was seasoned for 30 seconds by introducing argon at 120 sccm, nitrogen at 500 sccm, and ammonia at 10 sccm while applying 500 W to the sputtering target. During the seasoning, the substrate upon which the active layers were deposited was present within the chamber. During the seasoning, no deposition occurred on the substrate. The ammonia was then purged out of the chamber for 12 seconds while the power was reduced to 10 W and the argon and nitrogen flow remained constant. Deposition of the gate control layer then proceeded. During the deposition of the gate control layer, the power was maintained at 500 W, the argon was maintained at 120 sccm and the nitrogen was maintained at 500 sccm. The flow rate of $N_2O$, however, was adjusted to alter the composition of the gate control layer. At the beginning of the deposition, no $N_2O$ was provided for the first 30 seconds. Then, $N_2O$ was introduced at 40 sccm for 36 seconds, shut off for 24 seconds, introduced for 30 seconds at 30 sccm and shut-off for 24 seconds. When the $N_2O$ was shut off, the target was seasoned, but deposition occurred onto the substrate simultaneous with the seasoning. The deposition onto the substrate had no negative impact upon the TFT because the material that was removed from the target during the seasoning was consistent with the material forming the desired gate control layer. Also, the power level, the hydrogen gas content and the oxygen gas content determine if the sputtering will simply be a seasoning process or both a seasoning process and a deposition process.

Following deposition of the gate control layer, the bulk layer was deposited while maintaining the power at 500 W, the argon at 120 sccm, the nitrogen at 500 sccm and the $N_2O$ at 30 sccm for 300 seconds. Following deposition of the bulk layer, the interface control layer was deposited at a power level of 1000 W, an argon flow rate of 120 sccm and a nitrogen flow rate of 500 sccm. The $N_2O$ flow rate was incrementally increased by 10 sccm from 30 sccm every 24 seconds.

TABLE II

| Power W | Time sec | Ar sccm | $N_2$ sccm | $N_2O$ sccm | $NH_3$ sccm | Active Layer |
|---|---|---|---|---|---|---|
| 500 | 30 | 120 | 500 | 0 | 10 | GC |
| 10 | 12 | 120 | 500 | 0 | 0 | |
| 500 | 30 | 120 | 500 | 0 | 0 | |
| 500 | 36 | 120 | 500 | 13 | 0 | |
| 500 | 18 | 120 | 500 | 0 | 0 | |
| 500 | 18 | 120 | 500 | 30 | 0 | |
| 1500 | 12 | 120 | 500 | 30 | 0 | |
| 800 | 18 | 120 | 500 | 30 | 0 | |
| 500 | 300 | 120 | 500 | 30 | 0 | Bulk |
| 1000 | 24 | 120 | 500 | 30 | 0 | IC |
| 1000 | 24 | 120 | 500 | 40 | 0 | |
| 1000 | 24 | 120 | 500 | 50 | 0 | |
| 1000 | 24 | 120 | 500 | 60 | 0 | |
| 1000 | 24 | 120 | 500 | 70 | 0 | |
| 500 | 60 | 120 | 500 | 0 | 0 | |

Table II shows the deposition conditions for a multi-layer active material for a TFT according to another embodiment. The deposition occurred at a temperature of 180 degrees Celsius in a processing chamber having zinc sputtering target with a size of about 4650 cm² and a chamber volume of about 130000 cm³. The first layer deposited was the gate control layer that was deposited over the gate dielectric layer. Prior to depositing the gate control layer, the target was seasoned for 30 seconds by introducing argon at 120 sccm, nitrogen at 500 sccm, and ammonia at 10 sccm while applying 500 W to the sputtering target. During the seasoning, the substrate upon which the active layers were deposited was present within the chamber. During the seasoning, no deposition occurred on the substrate. The ammonia was then purged out of the chamber for 12 seconds while the power was reduced to 10 W and the argon and nitrogen flow remained constant. Deposition of the gate control layer then proceeded. During the deposition of the gate control layer, the power was maintained at 500 W, the argon was maintained at 120 sccm, and the nitrogen was maintained at 500 sccm while the $N_2O$ flow was altered. At the beginning of the deposition, no $N_2O$ was provided for the first 30 seconds. Then, $N_2O$ was introduced at 13 sccm for 36 seconds, shut off for 18 seconds, and introduced for 18 seconds at 30 sccm. Then, the $N_2O$ was maintained at 30 sccm for 12 seconds while the power was increased to 1500 W. The power level was then reduced to 800 W for 18 seconds. When the $N_2O$ was shut off, the target was seasoned, but deposition occurred onto the substrate simultaneous with the seasoning. Additionally, when the power level was at 800 W, the target was seasoned, but deposition of material onto the substrate occurred. The deposition onto the substrate had no negative impact upon the TFT because the material that was removed from the target during the seasoning was consistent with the material forming the desired gate control layer. Also, the power level, the hydrogen gas content and the oxygen gas content determine if the sputtering will simply be a seasoning process or both a seasoning process and a deposition process.

Following deposition of the gate control layer, the bulk layer was deposited while maintaining the power at 500 W, the argon at 120 sccm, the nitrogen at 500 sccm, and the $N_2O$ at 30 sccm for 300 seconds. Following deposition of the bulk layer, the interface control layer was deposited at a power level of 1000 W, an argon flow rate of 120 sccm, and a nitrogen flow rate of 500 sccm. The $N_2O$ flow rate was incrementally increased by 10 sccm from 30 sccm every 24 seconds. Finally, the deposition of the interface control layer was terminated by reducing the power level to 500 W, maintaining the argon flow rate at 120 sccm, maintaining the nitrogen flow rate at 500 sccm, and eliminating the $N_2O$ flow for 60 seconds.

TABLE III

| Power W | Time sec | Ar sccm | $N_2$ sccm | $N_2O$ sccm | $NH_3$ sccm | Active Layer |
|---|---|---|---|---|---|---|
| 500 | 30 | 120 | 500 | 0 | 10 | GC |
| 2300 | 30 | 120 | 500 | 30 | 0 | |
| 500 | 18 | 120 | 500 | 0 | 0 | |
| 800 | 30 | 120 | 500 | 30 | 0 | |
| 1800 | 24 | 120 | 500 | 30 | 0 | |
| 500 | 30 | 120 | 500 | 30 | 0 | |
| 1500 | 24 | 120 | 500 | 30 | 0 | |
| 500 | 30 | 120 | 500 | 30 | 0 | |
| 1000 | 18 | 120 | 500 | 30 | 0 | Bulk |
| 500 | 240 | 120 | 500 | 30 | 0 | |
| 1000 | 24 | 120 | 500 | 30 | 0 | |
| 1000 | 24 | 120 | 500 | 40 | 0 | IC |
| 1000 | 24 | 120 | 500 | 50 | 0 | |
| 1000 | 24 | 120 | 500 | 60 | 0 | |
| 1000 | 24 | 120 | 500 | 70 | 0 | |
| 1000 | 24 | 120 | 500 | 80 | 0 | |

Table III shows the deposition conditions for a multi-layer active material for a TFT according to another embodiment. The deposition occurred at a temperature of 300 degrees Celsius in a processing chamber having zinc sputtering target with a size of about 4650 cm² and a chamber volume of about 130000 cm³. The first layer deposited was the gate control layer that was deposited over the gate dielectric layer. Prior to depositing the gate control layer, the target was seasoned for 30 seconds by introducing argon at 120 sccm, nitrogen at 500 sccm and ammonia at 10 sccm while applying 500 W to the sputtering target. During the seasoning, the substrate upon which the active layers were deposited was present within the chamber. During the seasoning, no deposition occurred on the substrate. Deposition of the gate control layer then proceeded.

During the deposition of the gate control layer, the argon was maintained at 120 sccm and the nitrogen was maintained at 500 sccm. In the initial phase of the deposition, the power applied was 2300 W and the $N_2O$ flow rate was 30 sccm. Then, the power level was dropped to 500 W and the $N_2O$ flow rate reduced to 0 sccm for 18 seconds. Then, the $N_2O$ flow rate was increased to 30 sccm for the remainder of the deposition of the gate control layer. The power level rose to 800 W for 30 seconds, increased to 1800 W for 24 seconds, reduced to 500 W for 30 seconds, increased to 1500 W for 24 seconds and reduced to 500 W for 30 seconds. When the $N_2O$ was shut off, the target was seasoned and no deposition occurred on the substrate.

Following deposition of the gate control layer, the bulk layer was deposited. The deposition began at 1000 W for 18 seconds with a flow rate of 120 sccm argon, 500 sccm nitrogen and 30 sccm $N_2O$. The argon, nitrogen and $N_2O$ flow rates remained constant during the bulk layer deposition. The power level was reduced to 500 W for 240 seconds and then increased to 1000 W for 24 seconds.

Following deposition of the bulk layer, the interface control layer was deposited at a power level of 1000 W, an argon flow rate of 120 sccm and a nitrogen flow rate of 500 sccm. The N₂O flow rate was incrementally increased by 10 sccm from 30 sccm every 24 seconds.

TABLE IV

| Power W | Time sec | Ar sccm | N₂ sccm | O₂ sccm | H₂ sccm | Active Layer |
|---|---|---|---|---|---|---|
| 500 | 30 | 40 | 500 | 5 | 80 | GC |
| 500 | 30 | 120 | 500 | 0 | 0 | |
| 1000 | 60 | 120 | 500 | 10 | 0 | |
| 1000 | 30 | 120 | 500 | 70 | 0 | |
| 500 | 30 | 120 | 500 | 0 | 0 | Bulk |
| 500 | 100 | 120 | 500 | 15 | 0 | |
| 500 | 30 | 120 | 500 | 60 | 0 | |
| 500 | 30 | 120 | 500 | 0 | 0 | |
| 500 | 100 | 120 | 500 | 20 | 0 | |
| 500 | 30 | 120 | 500 | 60 | 0 | |
| 500 | 30 | 120 | 500 | 0 | 0 | |
| 500 | 60 | 120 | 500 | 25 | 0 | |
| 500 | 60 | 120 | 500 | 30 | 0 | |
| 500 | 60 | 120 | 500 | 35 | 0 | |
| 500 | 60 | 120 | 500 | 40 | 0 | |
| 500 | 30 | 120 | 500 | 70 | 0 | |
| 500 | 30 | 120 | 500 | 0 | 0 | IC |
| 1000 | 24 | 120 | 500 | 10 | 0 | |
| 1000 | 24 | 120 | 500 | 30 | 0 | |
| 1000 | 24 | 120 | 500 | 40 | 0 | |
| 1000 | 24 | 120 | 500 | 50 | 0 | |
| 1000 | 24 | 120 | 500 | 60 | 0 | |
| 500 | 30 | 40 | 0 | 0 | 80 | |

Table IV shows the deposition conditions for a multi-layer active material for a TFT according to another embodiment. The deposition occurred at a temperature of 300 degrees Celsius in a processing chamber having zinc sputtering target with a size of about 4650 cm² and a chamber volume of about 130000 cm³. The first layer deposited was the gate control layer that was deposited over the gate dielectric layer. Prior to depositing the gate control layer, the target was seasoned for 30 seconds by introducing argon at 40 sccm, nitrogen at 500 sccm, oxygen at 5 sccm, and hydrogen at 80 sccm while applying 500 W to the sputtering target. During the seasoning, the substrate upon which the active layers were deposited was present within the chamber. During the seasoning, a small amount of deposition occurred on the substrate. Then, the oxygen and hydrogen flow was shut-off and the seasoning continued for 30 seconds with an argon flow rate of 120 sccm and a nitrogen flow rate of 500 sccm. When the oxygen and hydrogen were shut-off, the seasoning continued, but no deposition occurred on the substrate. Deposition of the gate control layer then proceeded.

During the deposition of the gate control layer, the argon was maintained at 120 sccm and the nitrogen was maintained at 500 sccm. In the initial phase of the deposition, the power applied was 1000 W, the argon flow rate was 120 sccm, the nitrogen flow rate was 500 sccm, the oxygen flow rate was 10 sccm, and no hydrogen was provided. The deposition occurred for 60 seconds. Then, the oxygen flow rate was increased for 30 seconds to 70 sccm.

Following deposition of the gate control layer, the bulk layer was deposited. The deposition occurred at a power level of 500 W, an argon flow rate of 120 sccm, and a nitrogen flow rate of 500 sccm. The oxygen flow rate fluxuated during the deposition. For the first 30 seconds, no oxygen was introduced. Then, the oxygen was introduced for 100 seconds at 15 sccm. The oxygen flow rate was increased to 60 sccm for 30 seconds and then shut-off for 30 seconds. The oxygen was again introduced at 20 sccm for 100 seconds and increased to 60 sccm for 30 seconds before being shut-off again for 30 seconds. The oxygen flow resumed at 25 sccm for 60 seconds and then increased to 30 sccm for 60 seconds, 35 sccm for 60 seconds, 40 sccm for 60 seconds and finally 70 sccm for 30 seconds. When no oxygen was provided to the chamber, the target was seasoned without any deposition occurring onto the substrate.

Following deposition of the bulk layer, the interface control layer was deposited. The target was initially seasoned after the bulk layer deposition at 500 W for 30 seconds with a flow rate of 120 sccm argon and 500 sccm nitrogen. No deposition occurred on the substrate. Then, the power level was increased to 1000 W with a flow rate of 120 sccm argon and 500 sccm nitrogen while the flow rate of oxygen increased from 10 sccm to 60 sccm in 10 sccm increments every 24 seconds. Finally, the target was seasoned by providing a power level of 500 W to the target for 30 seconds while introducing argon at a flow rate of 40 seem and hydrogen at a flow rate of 80 sccm. During the seasoning, no deposition occurred on the substrate.

Thus, the seasoning may occur at three distinct time periods, before deposition of any active material layers, after deposition of all of the active material layers and during the deposition of the active material layers. In each time period, the seasoning may occur without any deposition occurring on the substrate. Therefore, the substrate may be present within the chamber with the gate dielectric exposed to the processing environment during the seasoning or even with the active material layers exposed to the processing environment during the seasoning.

In general, the seasoning may occur without deposition when the chamber temperature is about 180 degrees Celsius and 1500 W is applied to a sputtering target having a surface area of between about 4600 cm² and about 4700 cm², 120 sccm argon, 500 sccm nitrogen, no oxygen and either 5 sccm or above of ammonia or 10 sccm or above of hydrogen is provided to the chamber. If less power is used, then less ammonia or hydrogen is introduced. If the temperature is increased, less ammonia and less hydrogen are needed. In fact, at high temperatures such as about 300 degrees Celsius, the seasoning may occur without any hydrogen containing gas.

The target seasoning uses a plasma with argon; argon, nitrogen and hydrogen; or argon and hydrogen under the proper setting of temperature and power. The substrate temperature should be higher than about 150 degrees Celsius and the maximum power depends upon the substrate temperature. The higher the substrate temperature, the higher the maximum power that can be used. The process is used to remove the oxide or nitride cumulated on the surface of the sputtering target. The process could also be used to create a skin on the surface of the target or other place in the chamber to match the process conditions that will be present during deposition. The seasoning may occur at the beginning, the end or the middle of the deposition process. Even though the process may occur with the substrate in the chamber, it is also possible to utilize a dummy substrate with the same effect.

The seasoning of the target may be performed due to the buildup of the oxide or nitride layer on the surface of the sputtering target. In the absence of the seasoning, the sputtering process would not be practical for depositing the active material layer. The sputtering would not be practical because the sputtering would cease once a sufficient film had developed on the target that the DC bias would not sputter material. The sputtering would also not be practical because the ability to control the composition of the material deposited would diminish to the point where a consistent product could not be produced. A consistent product could not be produced because the material sputtered from the target having an oxide or nitride layer built up on the target is different than when a bare target is sputtered. In the case of the oxide or nitride layers, the material sputtered would likely deposit on the substrate as an oxide layer, a nitride layer and potentially other material that forms upon reacting with the elemental target. The oxide and nitride, when sputtered, would react differently than a bare target when sputtered. A bare target, when sputtered under predetermined, known conditions, will consistently deposit a layer having a predictable composition.

The exact composition of any layers deposited on the target surface during normal operation would not be obtainable without analysis of the oxide and nitride layers and would not be predictable. Hence, any sputtering of the layers would involve a substantial amount of unpredictability. In any fabrication facility, unpredictability could be quite costly. The crystallinity of the deposited layer may not be fully controllable without constant monitoring and adjustment of reactive gases. It stands to reason that with an oxide or nitride layer present, less oxygen or nitrogen gas would be utilized. The film properties would change throughout the deposited layer to produce a composition throughout the layer that would not be predictable and not consistent from substrate to substrate. To bring an element of predictability into the process, the target would need to be analyzed after a certain period of time to ensure that the composition of the material sputtered is known. The analysis would involve significant chamber downtime which is not practical in today's fabrication facilities. Therefore, having the ability to season the sputtering target without depositing any material onto the substrate prevents chamber shutdown for analysis and permits the technician to sputter deposit from a substantially bare target to produce a consistent product. Due to the unpredictability, sputtering has not been preferred approach to depositing active material layers.

By seasoning the sputtering target with the substrate within the chamber, sputtering may now be utilized to deposit the active material layers. The seasoning may occur with the substrate inside the chamber without any concern for material deposition thereon. The seasoning may be tailored to either permit material to deposit onto the substrate if desired or completely prevent any deposition onto the substrate. Substrate throughput may be reasonable because the seasoning could occur with the substrate in the chamber and without any need to shut-down the chamber to clean the target or clean with a dummy substrate. Due to the seasoning embodiments discussed herein, silicon may soon be replaced as the active material in TFTs because TFTs with higher mobility may be produced in about the same amount of time as silicon based TFTs if not quicker.

While the foregoing is directed to embodiments of the present invention, other and further embodiments of the invention may be devised without departing from the basic scope thereof, and the scope thereof is determined by the claims that follow.

The invention claimed is:

1. A method, comprising:
disposing a substrate onto a substrate support in a processing chamber, the processing chamber having a sputtering target disposed therein opposite the substrate support, the sputtering target comprising an element selected from the group consisting of zinc, cadmium, tin, indium, gallium, and combinations thereof;
performing a first seasoning process while the substrate is disposed on the substrate support, the first seasoning process comprising:
introducing an inert gas and a nitrogen containing gas into the processing chamber; and
applying a first DC bias to the sputtering target to sputter material from the target;
reducing the first DC bias to a second DC bias; and
performing a first sputtering process comprising:
introducing an oxygen containing gas along with the inert gas and nitrogen containing gas;
increasing the second DC bias to a third DC bias to sputter material from the target;
increasing the third DC bias to a fourth DC bias after supplying the oxygen containing gas for a predetermined time period during the first sputtering process; and
depositing a first layer having a first composition on the substrate that comprises oxygen, nitrogen, and one or more elements selected from the group consisting of zinc, cadmium, tin, indium, gallium, and combinations thereof.

2. The method of claim 1, wherein substantially no material deposits on the substrate during the first seasoning process.

3. The method of claim 2, further comprising:
performing a second seasoning process after the first sputtering process, the second seasoning process comprising:
reducing the flow of the oxygen containing gas while continuing to flow the inert gas and the nitrogen containing gas into the processing chamber; and
sputtering material from the target.

4. The method of claim 3, further comprising:
performing a second sputtering process after the second seasoning process, the second sputtering process comprising:
introducing the oxygen containing gas along with the inert gas and nitrogen containing gas;
sputtering material from the target; and
depositing a second layer having a second composition different than the first composition on the first layer that that comprises oxygen, nitrogen, and one or more elements selected from the group consisting of zinc, cadmium, tin, indium, gallium, and combinations thereof.

5. The method of claim 4, wherein substantially no material deposits on the substrate during the second seasoning process.

6. The method of claim 1, wherein the nitrogen containing gas comprises $N_2$.

7. The method of claim 6, wherein the oxygen containing gas comprises $N_2O$.

8. The method of claim 1, further comprising introducing a hydrogen containing gas into the processing chamber during the first seasoning process.

9. The method of claim 8, wherein the hydrogen containing gas comprises $NH_3$.

10. The method of claim 8, wherein the hydrogen containing gas comprises $H_2$.

11. A method, comprising:
disposing a substrate onto a substrate support in a processing chamber, the processing chamber having a sputtering target disposed therein opposite the substrate support, the sputtering target comprising an element selected from the group consisting of zinc, cadmium, tin, indium, gallium, and combinations thereof;
performing a sputtering process comprising:
introducing an inert gas, an oxygen containing gas, and a nitrogen containing gas into the processing chamber;
applying a first DC bias to the sputtering target to sputter material from the target;

increasing the first DC bias to a second DC bias after supplying the oxygen containing gas for a predetermined time period during the sputtering process; and depositing a layer on the substrate that comprises oxygen, nitrogen, and one or more elements selected from the group consisting of zinc, cadmium, tin, indium, gallium, and combinations thereof; and performing a seasoning process comprising:

reducing the flow of oxygen containing gas to the processing chamber while continuing to flow the inert gas and the nitrogen containing gas; and lowering the second DC bias to a third DC bias to sputter material from the sputtering target while the substrate remains in the processing chamber.

12. The method of claim 11, wherein substantially no material deposits on the substrate during the seasoning process.

13. The method of claim 11, wherein the nitrogen containing gas comprises $N_2$.

14. The method of claim 13, wherein the oxygen containing gas comprises $N_2O$.

15. A method, comprising:

disposing a substrate onto a substrate support in a processing chamber, the processing chamber having a sputtering target disposed therein opposite the substrate support, the sputtering target comprising a metal selected from the group consisting of zinc, cadmium, tin, indium, gallium, and combinations thereof;

performing a first sputtering process comprising:

introducing an inert gas, an oxygen containing gas, and a nitrogen containing gas into the processing chamber;

applying a first DC bias to the sputtering target to sputter material from the target;

increasing the first DC bias to a second DC bias after supplying the oxygen containing gas for a predetermined period; and depositing a first layer having a first composition on the substrate that comprises oxygen, nitrogen, and one or more metals selected from the group consisting of zinc, cadmium, tin, indium, gallium, and combinations thereof;

performing a first seasoning process comprising:

reducing the flow of oxygen containing gas to the processing chamber and reducing the second DC bias to a third DC bias while continuing to flow the inert gas and the nitrogen containing gas into the processing chamber; and sputtering material from the sputtering target while the substrate remains in the processing chamber;

performing a second sputtering process comprising:

introducing the oxygen containing gas into the processing chamber along with the inert gas and the nitrogen containing gas;

increasing the third DC bias to a fourth DC bias; and depositing a second layer having a second composition different than the first composition on the substrate that comprises oxygen, nitrogen, and one or more metals selected from the group consisting of zinc, cadmium, tin, indium, gallium, and combinations thereof.

16. The method of claim 15, further comprising performing a second seasoning process after the second sputtering process, comprising:

reducing the flow of oxygen containing gas to the processing chamber while continuing to flow the inert gas and the nitrogen containing gas into the processing chamber;

reducing the fourth DC bias back to third DC bias; and sputtering material from the sputtering target while the substrate remains in the processing chamber.

17. The method of claim 16, further comprising performing a third seasoning process before the first sputtering process, comprising:

reducing the flow of oxygen containing gas to the processing chamber while continuing to flow the inert gas and the nitrogen containing gas into the processing chamber; and sputtering material from the sputtering target while the substrate remains in the processing chamber.

18. The method of claim 17, wherein substantially no material deposits on the substrate during the third seasoning process.

19. The method of claim 17, wherein the nitrogen containing gas comprises $N_2$.

20. The method of claim 19, wherein the oxygen containing gas comprises $N_2O$.

* * * * *